(12) United States Patent
Kim

(10) Patent No.: US 7,880,216 B2
(45) Date of Patent: Feb. 1, 2011

(54) FLASH MEMORY DEVICE AND METHOD OF FABRICATING THE SAME

(75) Inventor: Choong Bae Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/163,707

(22) Filed: Jun. 27, 2008

(65) Prior Publication Data
US 2009/0140378 A1 Jun. 4, 2009

(30) Foreign Application Priority Data
Nov. 29, 2007 (KR) .................. 10-2007-0122637

(51) Int. Cl.
*H01L 29/766* (2006.01)
*G11C 16/04* (2006.01)
(52) U.S. Cl. .................. 257/315; 365/185.33
(58) Field of Classification Search .................. 257/508, 257/296, 300, 314, E21.423, E21.613, E21.586, 257/E21.526, E23.142, E21.645, 510, 315, 257/316; 438/287, 637, 264, 113, 106, 700; 365/185.33, 185.29, 185.01, 185.26; 711/E12.008, 711/E12.007, 105
See application file for complete search history.

(56) References Cited

U.S. PATENT DOCUMENTS 6,936,885 B2 * 8/2005 Shin et al. .................. 257/315
2004/0067618 A1 * 4/2004 Chang et al. .................. 438/264
2005/0287763 A1 * 12/2005 Kim et al. .................. 438/424
2007/0145460 A1 * 6/2007 Lee .................. 257/314
2007/0201272 A1 * 8/2007 Okazaki et al. ........ 365/185.05

FOREIGN PATENT DOCUMENTS

KR 10-1993-0006944 4/1993

OTHER PUBLICATIONS

S.M. Sze, Semiconductor Devices, 2002, John Willey & Sons, Inc., p. 372.*

* cited by examiner

*Primary Examiner*—Thomas L Dickey
*Assistant Examiner*—Nikolay Yushin
(74) *Attorney, Agent, or Firm*—Townsend and Townsend and Crew LLP

(57) ABSTRACT

In a method of fabricating a flash memory device, trenches are formed in an isolation area of a semiconductor substrate. A first insulating layer is formed on sidewalls and bottoms of the trenches. Conductive layer patterns are formed on the first insulating layers at the bottoms of the trenches. A second insulating layer is formed on the conductive layer patterns. Gate lines are formed over a semiconductor substrate including the second insulating layer. The gate lines intersect the conductive layer patterns. Junctions are formed on the semiconductor substrate between the gate lines. An interlayer insulating layer is formed over the semiconductor substrate including the gate lines. Contact holes are formed through which the conductive layer patterns and the junctions located on one side of the conductive layer patterns are exposed. The contact holes are gap-filled with a conductive material, thereby forming contact plugs.

7 Claims, 5 Drawing Sheets

FLASH MEMORY DEVICE AND METHOD OF FABRICATING THE SAME

CROSS-REFERENCES TO RELATED APPLICATIONS

The present application claims priority to Korean patent application number 10-2007-0122637, filed on Nov. 29, 2007, which is incorporated by reference in its entirety.

BACKGROUND OF THE INVENTION

The present invention relates to a flash memory device and a method of fabricating the same and, more particularly, to a flash memory device and a method of fabricating the same, which can solve problems, such as low reliability of the device, which occurs during a drain contact process, by connecting a junction and a bit line without an additional drain contact process.

A flash memory device can be classified into a NOR structure in which a cell is connected in parallel between a bit line and the ground, and a NAND type structure in which a cell is connected in series between a bit line and the ground depending on the structure of a cell array. A cell array of the NAND flash memory device includes cell strings in each of which a plurality of cells for storing data therein is connected in series, and a drain select transistor and a source select transistor connected to opposite ends of the cell strings. Further, the drain select transistor is connected to a drain select line DSL and the source select transistor is connected to a source select line SSL. The drain of the drain select transistor exists in every cell string and is connected to a bit line BL through a drain contact DCT. Further, the sources of all of the source select transistors are connected in parallel to a common source line. A plurality of cells sharing the same word line WL constitute one page. Further, the number of cell strings is equal to the number of bit lines, so the number of drain select transistors and the number of the source select transistors are also equal to the same number.

Recently, with the high integration of NAND flash memory devices, a bowing phenomenon has become more common in which a width at the intermediate depth of a contact hole is widened when forming a drain contact plug since the height of the gate is increased. As a space between the drain contact plugs is narrowed, a short margin is decreased and a short failure is generated between the drain contact plugs.

Further, when forming bit lines on the drain contact plug, the short of the bit lines or a leakage problem is generated due to an overlay failure. Accordingly, during processes of connecting the bit lines and the junctions through the drain contact plugs, several problems in reliability of devices, such as increased resistance, as well as the above problems are generated.

BRIEF SUMMARY OF THE INVENTION

The present invention is directed towards a flash memory device and a method of fabricating the same, which can solve problems, such as low reliability of the device, which occurs during a drain contact process, by connecting a junction and a bit line without an additional drain contact process.

A method of fabricating a flash memory device in accordance with an aspect of the present invention includes forming trenches in an isolation area of a semiconductor substrate; forming a first insulating layer on sidewalls and bottoms of the trenches; forming conductive layer patterns on the first insulating layers at the bottoms of the trenches; forming a second insulating layer on the conductive layer patterns; forming gate lines over a semiconductor substrate including the second insulating layer, the gate lines intersecting the conductive layer patterns; forming junctions on the semiconductor substrate between the gate lines; forming an interlayer insulating layer over the semiconductor substrate including the gate lines; forming contact holes through which the conductive layer patterns and the junctions located on one side of the conductive layer patterns can be exposed; and gap-filling the contact holes with a conductive material, thereby forming contact plugs.

The first insulating layer is formed to a thickness of 50 to 1000 angstroms using an oxide layer.

The conductive layer patterns may be used as bit lines.

The conductive layer patterns may be formed using conductive material, such as W, Al, Cu, Co, CoSi or Si.

The conductive layer patterns may be formed by gap-filling a conductive layer on the first insulating layer within the trenches and then performing an etchback process.

Each of the conductive layer patterns is formed to have a height of 100 to 1000 angstroms through the etchback process.

The second insulating layer is formed from a high-density plasma (HDP) oxide layer or polysiliane (PSZ).

The formation of the second insulating layer may include forming the second insulating layer and then performing a chemical mechanical polishing (CMP) process.

The gate lines comprise a drain select line, a source select line, and word lines.

The gate lines comprise a conductive layer for a charge trap gate, a blocking insulating layer, and a conductive layer for a control gate.

The conductive layer for the charge trap gate is formed of a nitride layer or a silicon nitride layer.

The contact plugs may be formed in a drain select line.

The contact plugs may be formed from W or Al.

The formation of the contact plugs may include gap-filling a metal material and then performing a CMP process.

A flash memory device in accordance with an aspect of the present invention includes isolation layers formed in an isolation area of a semiconductor substrate, conductive layer patterns formed within the isolation layers, gate lines formed to intersect the conductive layer patterns over the semiconductor substrate, junctions formed on the semiconductor substrate between the gate lines, an interlayer insulating layer formed over the semiconductor substrate including the gate lines, contact holes formed to expose the conductive layer patterns and the junctions located on one side of the conductive layer patterns, and contact plugs formed to gap-fill the contact holes with a conductive material.

Each of the isolation layers comprises first and second insulating layers.

The first insulating layer is formed of an oxide layer, and the second insulating layer is formed of a HDP oxide layer or PSZ.

The conductive layer patterns may be formed using conductive material, such as W, Al, Cu, Co, CoSi or Si.

The conductive layer patterns may be formed lower in height than a top surface of the semiconductor substrate.

The gate lines has a silicon-oxide-nitride-oxide-silicon (SONOS) structure.

The contact plug is formed from W or Al.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1A:
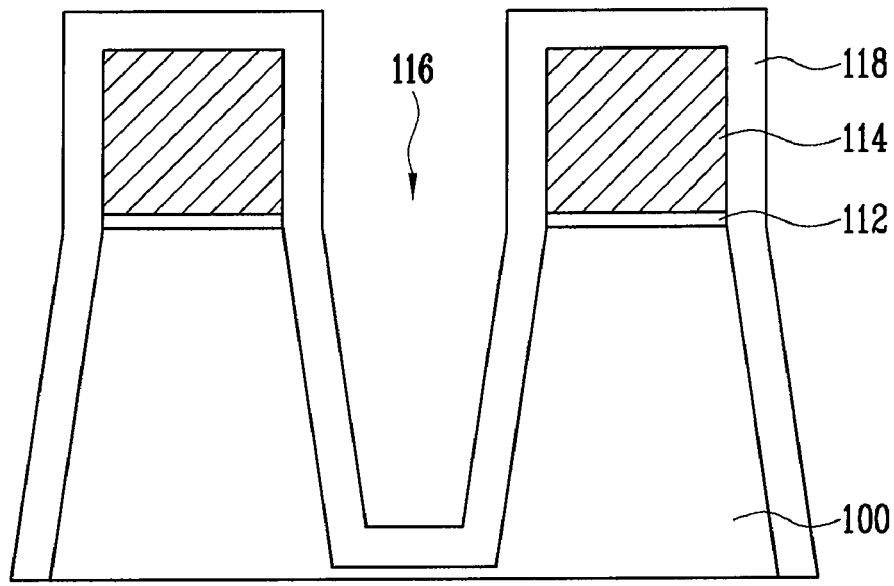
FIGS. 1A to 1G are sectional views sequentially illustrating a method of fabricating a flash memory device in accordance with the present invention.

Referring to FIG. 1A, a first insulating layer 118 is formed on sidewalls and bottoms of trenches 116 formed in an isolation area of a semiconductor substrate 100. More specifically, a pad oxide layer, serving as a buffer layer of a pad nitride layer, and the pad nitride layer are sequentially formed over the semiconductor substrate 100. The trenches 116 are formed in the isolation area of the semiconductor substrate 100 by etching a part of the pad nitride layer, the pad oxide layer and the semiconductor substrate 100 using an etch process employing an isolation mask. A liner dielectric layer (not shown) may be formed on the sides of the trenches 116. The liner dielectric layer (not shown) may be formed of silicon oxide ($SiO_2$) using a thermal oxidization process. The first insulating layer 118 is formed on the entire surface along the sidewalls and bottoms of the trenches 116, including pad nitride layer patterns 114 and pad oxide layer patterns 112. The first insulating layer 118 may be formed to a thickness of 50 to 1000 angstroms using an oxide layer.

Figure 1B:
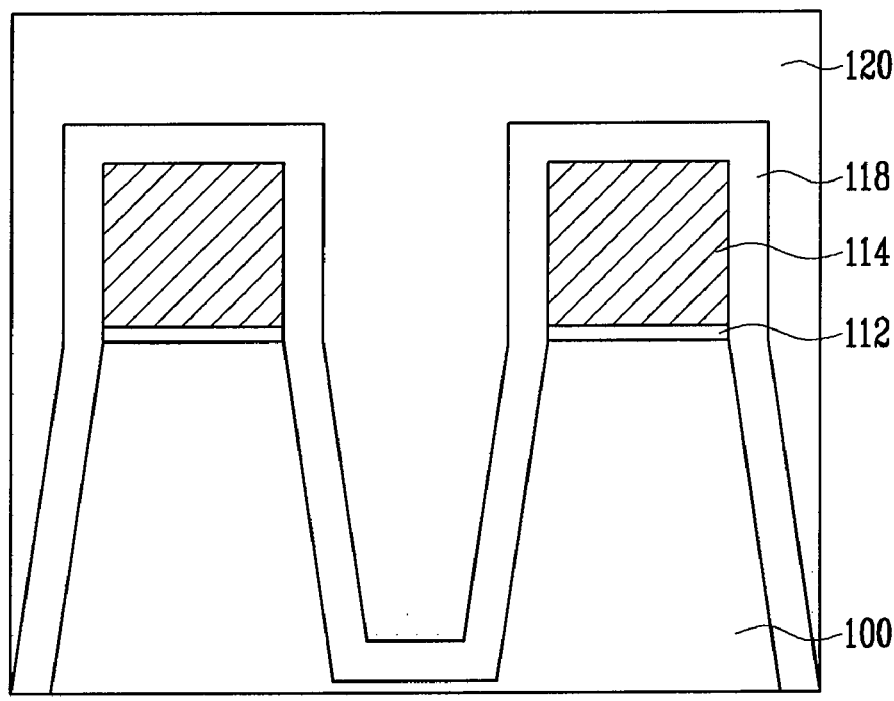

Referring to FIG. 1B, a conductive layer 120 for gap-filling the trenches 116 is formed over the semiconductor substrate 100 having the first insulating layer 118 formed thereon. The conductive layer 120 may be formed from conductive material such as W, Al, Cu, Co, CoSi or Si.

Figure 1C:
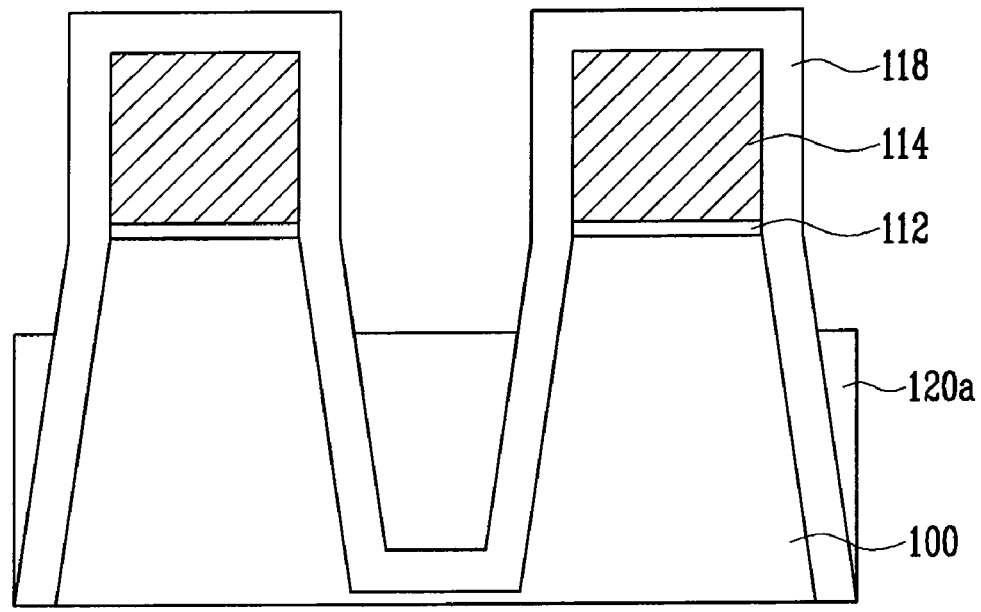

Referring to FIG. 1C, conductive layer patterns 120a are formed on the first insulating layer 118 within the trenches 116. The conductive layer patterns 120a may be formed to a proper height using an etchback process such that the conductive layer 120 remains only at the bottoms of the trenches 116. That is, the conductive layer patterns 120a may be formed to a height of 100 to 1000 angstroms from the bottom of the trench 116 using the etchback process. This is because the conductive layer patterns 120a are used as bit lines BL.

In other words, as in an embodiment of the present invention, when the bit lines BL comprised of the conductive layer patterns 120a are formed in the isolation area, the bit lines BL are formed in parallel to subsequent junctions. Thus, the junctions and the bit lines BL can be easily connected by subsequent drain contact plugs, so a typical drain contact process can be omitted. Accordingly, a reliability problem of devices, which may happen due to the drain contact process, can be solved.

Figure 1D:
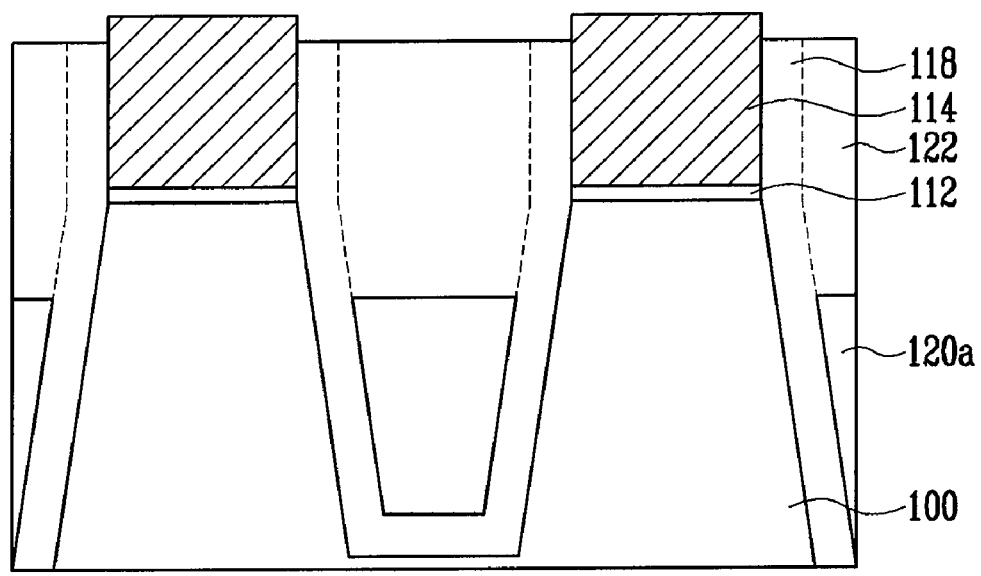

Referring to FIG. 1D, a second insulating layer 122 is formed on the entire surface of the semiconductor substrate 100 in which the bit lines BL are formed. The second insulating layer 122 may be formed of a high-density plasma (HDP) oxide layer or polysiliane (PSZ). After the second insulating layer 122 is formed, a chemical mechanical polishing (CMP) process is performed to polish the surface. As the second insulating layer 122 is formed on the bit lines BL comprised of the conductive layer patterns 120a, the four sides of the bit lines BL are surrounded by the first and second insulating layers 118, 120.

Figure 1E:
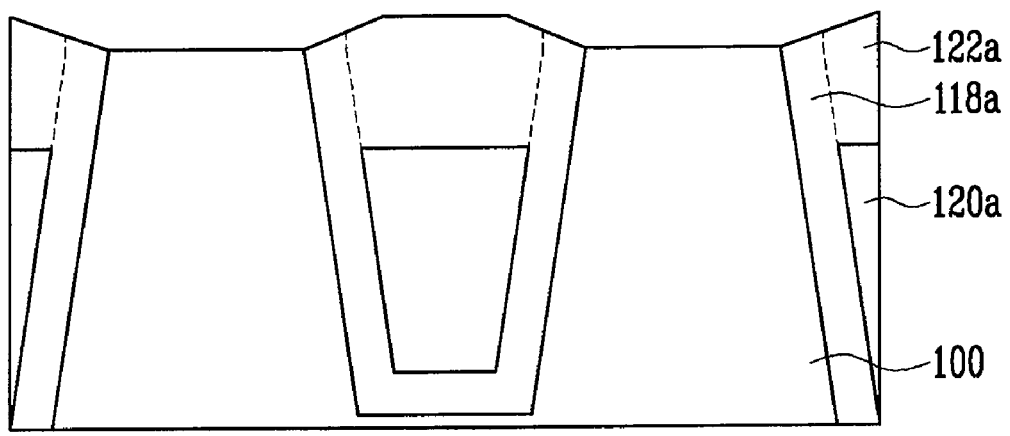

Referring to FIG. 1E, the pad nitride layer patterns 114 and the pad oxide layer patterns 112 formed on the active region of the semiconductor substrate 100 are removed. The pad nitride layer patterns 114 may be removed using a wet etch process employing a $H_3PO_4$ chemical solution. Further, when the pad nitride layer patterns 114 are removed, a part of the first insulating layer 118 and the second insulating layer 122 formed on the surfaces of the pad nitride layer patterns 114 is also removed. Thus, the first insulating layer 118 and the second insulating layer 122 may exist in the form of etched first insulating layers 118a and etched second insulating layers 122a. The second insulating layer 122 remaining on the conductive layer patterns 120a can be removed such that a top surface of the conductive layer pattern 120a is not exposed.

Figure 1F:
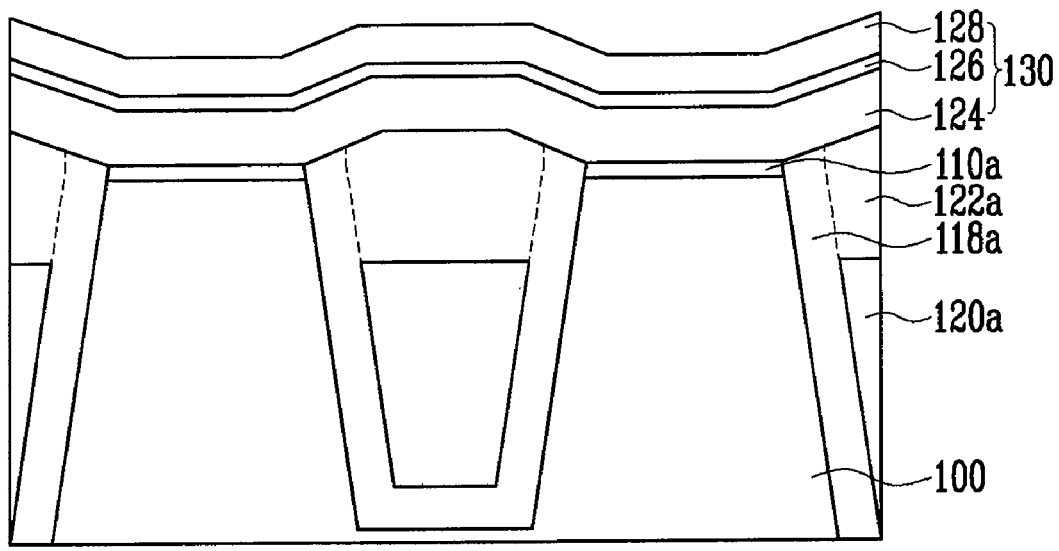

Referring to FIG. 1F, a stack gate conductive layer 130 is formed over the semiconductor substrate 100 including the second insulating layer. More specifically, a tunnel insulating layer 110a formed from a thermal oxidization layer is formed on the active region of the semiconductor substrate 100. A conductive layer 124 for a charge trap gate, a blocking insulating layer 126 and a conductive layer 128 for a control gate are sequentially formed over the semiconductor substrate 100 including the tunnel insulating layer 110a. That is, the stack gate conductive layer 130 having a silicon-oxide-nitride-oxide-silicon (SONOS) structure, which is comprised of the tunnel insulating layer 110a, the conductive layer for the charge trap gate, the blocking insulating layer, and the conductive layer for the control gate, may be formed over the silicon semiconductor substrate 100. The conductive layer 124 for the charge trap gate may be formed from a nitride layer or a silicon nitride layer, and the conductive layer 128 for the control gate may be formed from a conductive layer for a gate having a high dielectric constant.

Figure 2A:
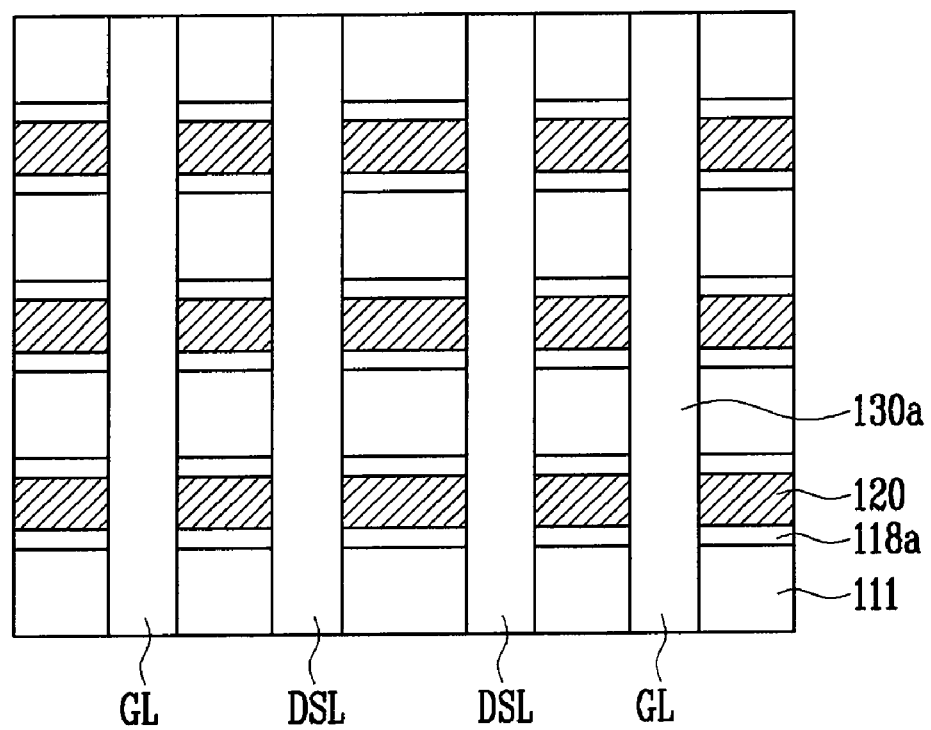
FIGS. 2A and 2B are plan views illustrating the method of fabricating a flash memory device in accordance with the present invention.

Referring to FIG. 2A, gate lines GL 130a are formed over the semiconductor substrate 100 by selectively etching the stack gate conductive layer 130 of the SONOS structure depending on a proper etch condition with respect to each layer. FIG. 2A is a plan view of the gate lines GL 130a after the etch process is performed on the stack gate conductive layer 130 shown in FIG. 1F. As can be seen from FIG. 2A, the gate lines GL 130a intersect the bit lines BL comprised of the conductive layer patterns 120a formed under the gate lines GL 130a. After the gate lines GL 130a are formed, junctions 111 are formed by performing an ion implantation process on the semiconductor substrate 100 on both sides of the gate lines GL 130a.

Figure 1G:
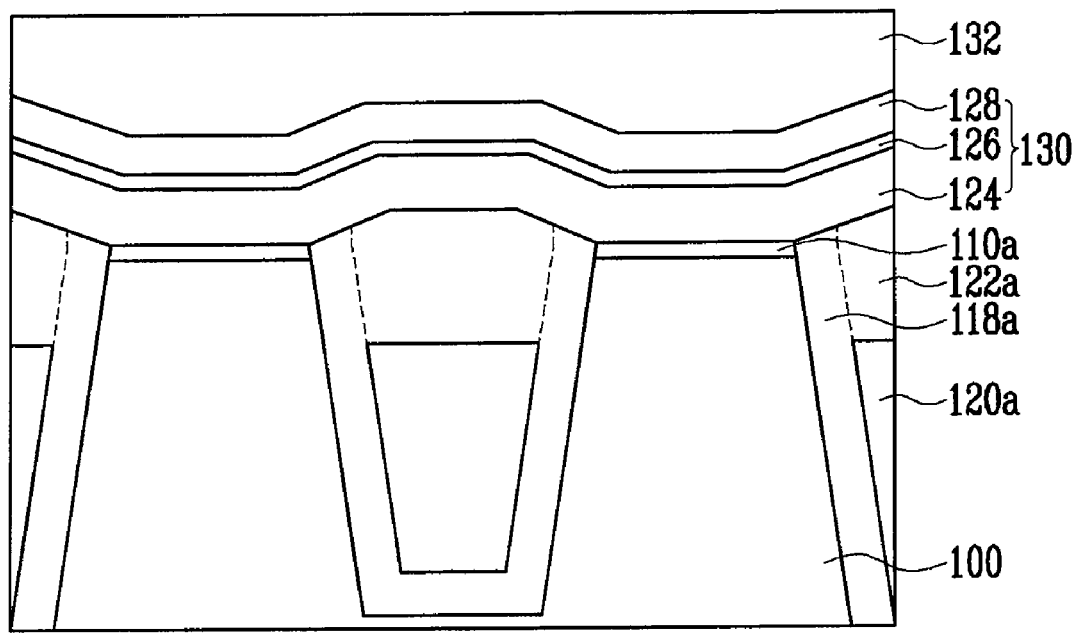

Referring to FIG. 1G, an interlayer dielectric (IDL) 132 is formed on the entire structure of the semiconductor substrate 100 including the gate lines GL 130a.

Figure 2B:
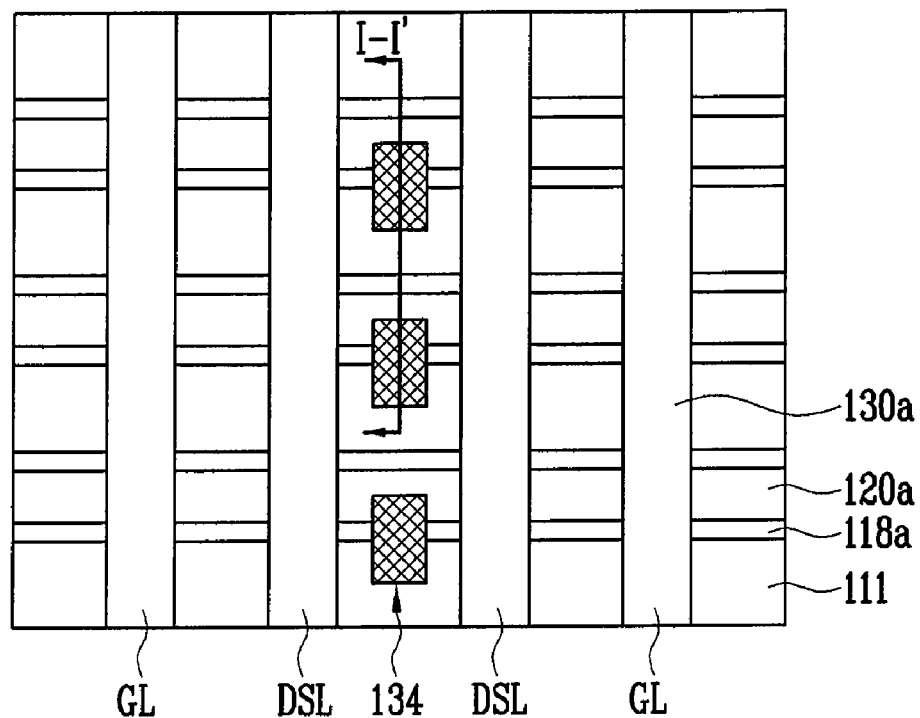

Referring to FIG. 2B, the ILD 132 is etched to form contact holes through which the bit lines BL comprised of the conductive layer patterns 120a and the junctions located in the active region on one side of the bit lines BL are exposed. The contact holes are gap-filled with a conductive material, thereby forming contact plugs 134. After the conductive material is gap-filled, a CMP process is performed such that the ILD 132 is exposed to remove a part of the conductive material. W or Al may be used as the conductive material for forming the contact plug 134.

FIG. 2B is a plan view of the gate lines GL 130a after the contact plugs 134 are formed after the etch process is performed on the interlayer insulating layer 132 in which the contact holes are formed in FIG. 1G. As can be seen from FIG. 2B, the contact plugs 134 are formed in the drain select line (DSL) area and therefore can horizontally connect the junctions and the bit lines BL, which are formed in the active region. In the present invention, it has been described that the contact plugs 134 are formed in the drain select line DSL. However, the contact plugs 134 may be formed in regions where contacts are to be formed other than the drain select line DSL using the above method.

Figure 3:
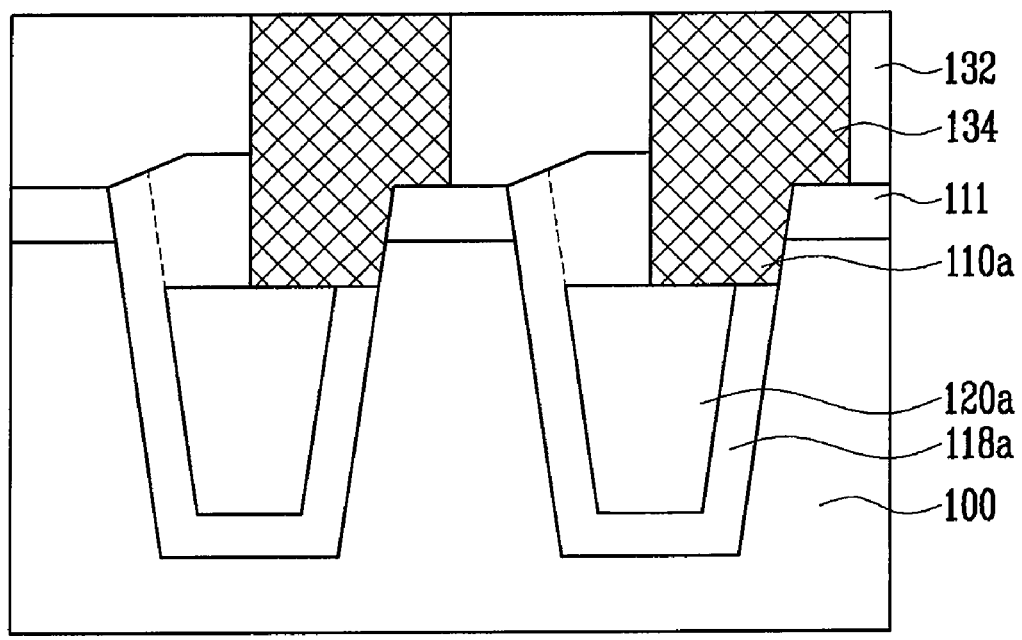
FIG. 3 is a sectional view of the flash memory device taken along line I-I' of FIG. 2B.

FIG. 3 is a sectional view of the flash memory device taken along line I-I' of FIG. 2B. In the present invention, the junctions (that is, the drain regions 111) and the bit lines BL comprised of the conductive layer patterns 120a are formed in the active region of the semiconductor substrate. The junctions and the bit lines BL are horizontally formed in the active region of the semiconductor substrate 100, instead of using typical vertical drain contact plugs connecting the junctions and formed on the junction. Thus, the junctions 111 and the bit lines BL can be easily connected by the drain contact plugs 134. Accordingly, a problem that resistance is increased, which is generated when forming contact plugs as flash memory devices become more highly integrated, can be improved and therefore the stability of device characteristics can be secured.

As described above, according to the present invention, in the process of forming a flash memory device, the conductive layer patterns are formed in the isolation area and are used as the bit lines. Thus, the junctions and the bit lines can be electrically connected by the drain contact plugs horizontally. That is, a typical vertical drain contact process for connecting the junctions and the bit lines can be omitted. Accordingly, several problems, including low reliability of devices occurring due to the drain contact process, can be solved.

Further, since the junctions and the bit lines are formed horizontally, an increase of resistance due to the cross section of the contact plugs, which is caused by the higher integration of devices, is not generated. Accordingly, the stability of device characteristics can be secured and the yield can be improved significantly.

The embodiments disclosed herein have been proposed to allow a person skilled in the art to implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A flash memory device comprising:
   isolation layers formed in trenches of isolation areas of a semiconductor substrate;
   conductive layer patterns formed within the isolation layers;
   gate lines formed to intersect the conductive layer patterns over the semiconductor substrate;
   junctions formed on the semiconductor substrate between the gate lines;
   an interlayer insulating layer formed over the semiconductor substrate including the gate lines;
   contact holes formed in the interlayer insulating layer and the isolation-layer layers to expose the conductive layer patterns and the junctions located on one side of the conductive layer patterns; and
   contact plugs formed to gap-fill the contact holes with a conductive material.

2. The flash memory device of claim 1, wherein each of the isolation layers comprises first and second insulating layers.

3. The flash memory device of claim 2, wherein:
   the first insulating layer is formed of an oxide layer, and
   the second insulating layer is formed of a high-density plasma (HDP) oxide layer or polysiliane (PSZ).

4. The flash memory device of claim 1, wherein the conductive layer patterns are formed using conductive material, as the conductive material comprising as least one of W, Al, Cu, Co, CoSi and Si.

5. The flash memory device of claim 1, wherein the conductive layer patterns are formed to be smaller in height than a top surface of the semiconductor substrate.

6. The flash memory device of claim 1, wherein the gate lines have a silicon-oxide-nitride-oxide-silicon (SONOS) structure.

7. The flash memory device of claim 1, wherein the contact plug is formed from W or Al.

* * * * *